(12) United States Patent
Zhang

(10) Patent No.: US 11,049,885 B2
(45) Date of Patent: Jun. 29, 2021

(54) ARRAY SUBSTRATE AND MANUFACTURING METHOD THEREOF, DISPLAY PANEL, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventor: Zhen Zhang, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 352 days.

(21) Appl. No.: 16/086,873

(22) PCT Filed: Feb. 12, 2018

(86) PCT No.: PCT/CN2018/076506
§ 371 (c)(1),
(2) Date: Sep. 20, 2018

(87) PCT Pub. No.: WO2019/019618
PCT Pub. Date: Jan. 31, 2019

(65) Prior Publication Data
US 2020/0328234 A1    Oct. 15, 2020

(30) Foreign Application Priority Data
Jul. 26, 2017   (CN) .......................... 201710620129.6

(51) Int. Cl.
*H01L 27/12*    (2006.01)
*G02F 1/1333*   (2006.01)
*H01L 27/32*    (2006.01)

(52) U.S. Cl.
CPC ...... *H01L 27/1248* (2013.01); *H01L 27/1244* (2013.01); *H01L 27/1262* (2013.01);
(Continued)

(58) Field of Classification Search
None
See application file for complete search history.

(56) References Cited

U.S. PATENT DOCUMENTS

| | | | |
|---|---|---|---|
| 2003/0013236 A1* | 1/2003 | Nakata | H01L 27/12 438/149 |
| 2007/0087534 A1* | 4/2007 | Yasukawa | H01L 27/127 438/478 |

(Continued)

FOREIGN PATENT DOCUMENTS

| | | |
|---|---|---|
| CN | 103700322 A | 4/2014 |
| CN | 104269417 A | 1/2015 |

(Continued)

OTHER PUBLICATIONS

International Search Report and Written Opinion dated Mar. 30, 2018; PCT/CN2018/076506.

*Primary Examiner* — Alexander G Ghyka

(57) ABSTRACT

An array substrate and a manufacturing method thereof, a display panel, and a display device are disclosed. The array substrate includes a base substrate including a bending region; and an insulating layer disposed on the base substrate wherein the insulating layer located in the bending region is provided with at least one recess and a surface of the recess includes a concave-convex structure.

14 Claims, 7 Drawing Sheets

(52) U.S. Cl.
CPC .... *H01L 27/1288* (2013.01); *G02F 1/133345* (2013.01); *H01L 27/1218* (2013.01); *H01L 27/3258* (2013.01)

(56) References Cited

U.S. PATENT DOCUMENTS

| | | |
|---|---|---|
| 2014/0097408 A1 | 4/2014 | Kim et al. |
| 2016/0093685 A1 | 3/2016 | Kwon et al. |
| 2017/0040406 A1 | 2/2017 | Park et al. |
| 2017/0092708 A1 | 3/2017 | Jeon |
| 2018/0331166 A1* | 11/2018 | Cho .................. H01L 27/3265 |

FOREIGN PATENT DOCUMENTS

| | | |
|---|---|---|
| CN | 106449695 A | 2/2017 |
| CN | 106601133 A | 4/2017 |
| CN | 106796949 A | 5/2017 |
| CN | 107424520 A | 12/2017 |
| KR | 20170038973 A | 4/2017 |

* cited by examiner

ARRAY SUBSTRATE AND MANUFACTURING METHOD THEREOF, DISPLAY PANEL, AND DISPLAY DEVICE

The present invention claims the benefits of Chinese patent application No. 201710620129.6, which was filed with the SIPO on Jul. 26, 2017 and is fully incorporated herein by reference as part of this application.

TECHNICAL FIELD

At least one embodiment of the present disclosure provides an array substrate and a manufacturing method thereof, a display panel, and a display device.

BACKGROUND

With the universalness of electronic display products, users have stricter requirements on an appearance, a structure and the like of an electronic display product; as a result, a frameless electronic display product such as a frameless display screen has been proposed to meet the demands. One of designed structures of the frameless display screen allows a non-display portion of the product to be capable of bending towards a backside of the display screen. However, a bending process may result in a breakage of part of signal lines, which may affect a product yield and leads to an increase of production cost.

SUMMARY

At least one embodiment of the present disclosure provides an array substrate, including: a base substrate including a bending region; and an insulating layer disposed on the base substrate, wherein the insulating layer located in the bending region is provided with at least one recess, and a surface of the recess includes a concave-convex structure.

For example, the array substrate provided by at least one embodiment of the present disclosure further includes a signal line at least partly disposed in the recess, wherein the signal line is configured to cover at least part of the concave-convex structure.

For example, in the array substrate provided by at least one embodiment of the present disclosure, a surface of the signal line located in the recess includes an uneven portion corresponding to the concave-convex structure.

For example, in the array substrate provided by at least one embodiment of the present disclosure, the insulating layer includes a first insulating layer, the first insulating layer is configured to at least cover the bending region; and the recess includes a first recess disposed in the first insulating layer.

For example, in the array substrate provided by at least one embodiment of the present disclosure, the first recess includes a first side and a second side which are disposed along an extending direction of the first recess and are disposed opposite to each other, at least one of the first side and the second side is formed as one of an inclined surface, a stepped surface and an arc surface, or a combination thereof.

For example, in the array substrate provided by at least one embodiment of the present disclosure, the insulating layer further includes a second insulating layer configured to at least cover the first recess, the second insulating layer is located between the signal line and the first insulating layer; and the recess includes a second recess located in the second insulating layer corresponding to the first recess.

For example, in the array substrate provided by at least one embodiment of the present disclosure, the second insulating layer includes at least one of polyimide and photoresist.

For example, in the array substrate provided by at least one embodiment of the present disclosure, the concave-convex structure includes at least one of: at least one convex portion and at least one concave portion.

At least one embodiment of the present disclosure provides a display panel, including any of the above-mentioned array substrates.

At least one embodiment of the present disclosure provides a display device, including any of the above-mentioned display panels.

At least one embodiment of the present disclosure provides a manufacturing method of an array substrate, including: providing a base substrate; forming an insulating layer on the base substrate, the base substrate including a bending region; and forming at least one recess in the insulating layer in the bending region, wherein a surface of the recess is formed with a concave-convex structure.

For example, the manufacturing method provided by at least one embodiment of the present disclosure further includes: forming a signal line on the base substrate formed with the insulating layer, wherein the signal line is at least partly located in the recess.

For example, in the manufacturing method provided by at least one embodiment of the present disclosure, forming the insulating layer and forming the recess in the insulating layer includes: forming a first insulating layer on the base substrate, the first insulating layer at least covering the bending region; and forming a first recess in the first insulating layer in the bending region.

For example, in the manufacturing method provided by at least one embodiment of the present disclosure, forming the concave-convex structure on the surface of the recess includes: performing an uneven etching process to a region of the first insulating layer formed with the first recess to form the concave-convex structure on a surface of the first recess.

For example, in the manufacturing method provided by at least one embodiment of the present disclosure, forming the insulating layer and forming the recess in the insulating layer further includes: forming a second insulating layer on the base substrate formed with the first insulating layer, the second insulating layer at least covering the first recess, the second insulating being located between the signal line and the first insulating layer; and forming a second recess in the second insulating layer corresponding to the first recess.

For example, in the manufacturing method provided by at least one embodiment of the present disclosure, the second insulating layer is a photoresist, forming the concave-convex structure on the surface of the recess includes: coating the photoresist on the first insulating layer in the first recess; and providing a gray tone mask on which a transmittance is unevenly distributed, exposing a surface of the photoresist in the second recess through the gray tone mask, and removing a portion of the photoresist subjected to exposure.

For example, in the manufacturing method provided by at least one embodiment of the present disclosure, forming the concave-convex structure on the surface of the recess includes: coating a photoresist on the second insulating layer; providing a gray tone mask on which a transmittance is uniformly distributed, exposing and developing the photoresist through the gray tone mask, with a remaining portion of the photoresist being unevenly distributed on a surface of the second recess; and etching a surface of the second insulating layer by using the remaining portion of the photoresist and then removing the remaining portion of the photoresist.

For example, in the manufacturing method provided by at least one embodiment of the present disclosure, forming the concave-convex structure on the surface of the recess includes: spraying a corrosive liquid onto a surface of the second recess to perform an uneven etching process to the surface of the second recess.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

Figure 1A:
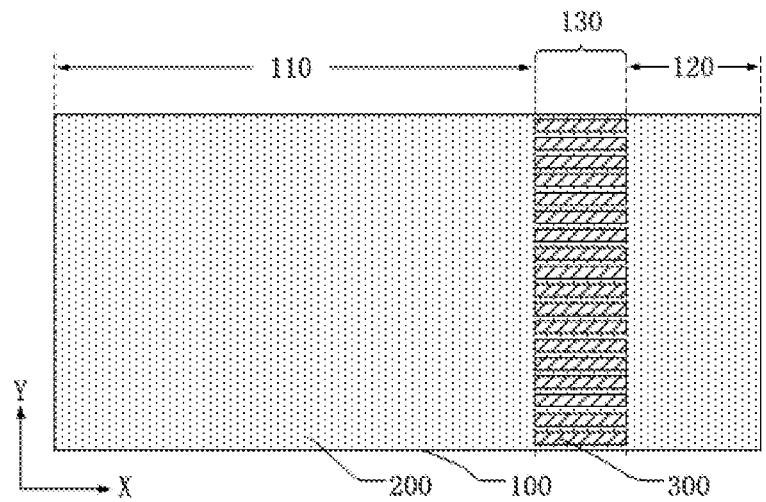
FIG. 1A is a plan view of an array substrate provided by an embodiment of the present disclosure.

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

At least one embodiment of the present disclosure provides an array substrate and a manufacturing method thereof, a display panel, and a display device. The array substrate includes a base substrate and an insulating layer disposed on the base substrate; the base substrate includes a bending region, and the insulating layer located in the bending region is provided with at least one recess, a surface of the recess includes a concave-convex structure; the concave-convex structure can increase an extension area of the surface of the recess, and can avoid a breakage of a component disposed on the surface of the recess during a bending process, thereby improving the product yield.

For example, in at least one embodiment of the present disclosure, the array substrate further includes a signal line at least partly disposed in the recess, wherein the signal line covers at least part of the concave-convex structure. The surface of the recess is provided with the concave-convex structure, thus when arranging the signal line, the concave-convex structure allows a surface of the signal line at the corresponding location to be uneven; that is, increasing an extension area of the signal line, improving a bending resistance of the signal line and reducing a risk of the signal line breaking during bending.

Hereinafter, the array substrate, the manufacturing method thereof, the display panel, and the display device according to at least one embodiment of the present disclosure are described in more details in conjunction with the drawings.

Figure 1B:
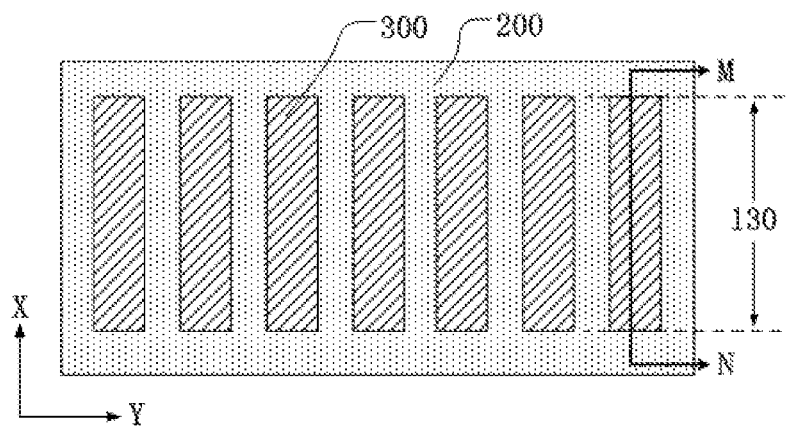
FIG. 1B is a plan view of a bending region and a periphery region thereof of the array substrate illustrated in FIG. 1A.

At least one embodiment of the present disclosure provides an array substrate. FIG. 1A is a plan view of an array substrate provided by an embodiment of the present disclosure; FIG. 1B is a plan view of a bending region and a periphery region thereof of the array substrate illustrated in FIG. 1A; and FIG. 1C is a schematic diagram of a cross-section taken along M-N in the array substrate illustrated in FIG. 1B.

Figure 1C:
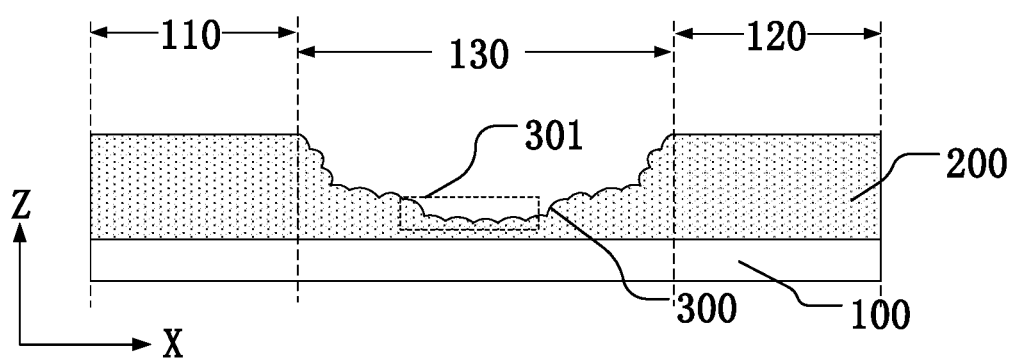
FIG. 1C is a schematic diagram of a cross-section taken along M-N in the array substrate illustrated in FIG. 1B.

As illustrated in FIGS. 1A, 1B and 1C, the array substrate includes a base substrate 100 and an insulating layer 200 disposed on the base substrate 100; the base substrate 100 includes a first functional region 110, a second functional region 120 and a bending region 130 disposed between the first functional region 110 and the second functional region 120; the insulating layer 200 located in the bending region 130 is provided with at least one recess 300, a surface of the recess 300 includes a concave-convex structure 301. The concave-convex structure 301 can increase an extension area of the surface of the recess 300 during bending, and can avoid a breakage of a component (e.g., a signal line 400 in the embodiment described below) disposed on the surface of the recess 300 during a bending process, thereby improving the product yield.

For example, in at least one embodiment of the present disclosure, the concave-convex structure includes at least one convex portion and/or at least one concave portion. By way of example, as illustrated in FIG. 1, the concave-convex structure 301 includes at least one microstructure, and the microstructure can be a convex portion or a concave portion. For example, a profile of a concave-convex structure constituted by a plurality of microstructures can present a wave-like shape, a zigzag shape or other irregular shapes. A specific dimension of the microstructure of the concave-convex structure 301 is not particularly limited in at least one embodiment of the present disclosure, as long as a boundary dimension of the microstructure is in an order of micron, e.g., 1 μm to 100 μm, further, in an order of 10 microns, e.g., 20 id m, 40 μm, 60 μm, 80 μm and the like.

For example, in at least one embodiment of the present disclosure, at least a portion of the base substrate 100 corresponding to the bending region 130 can be made of a flexible material so that the bending region 130 of the base substrate 100 can be bended by, for example, 180 degrees. For example, the flexible material can include polyimide, polymethyl methacrylate and the like.

For example, a distribution of functional structures of the array substrate is not particularly limited in at least one embodiment of the present disclosure but can be configured according to actual demands. For example, an amount of the second functional region 120 in the array substrate is not limited to only one but can be plural. Correspondingly, the bending region 130 connecting the first functional region 110 and the second functional region 120 can also be configured as plural. For example, in at least one embodiment of the present disclosure, the first functional region 110 of the array substrate can be a display region in which a display element is formed; the second functional region 120 can be an element region in which a display driving circuit and the like can be disposed; the bending region 130 can serve as a circuit connecting region between the display region and the element region.

Hereinafter, technical solution(s) of the following, at least one embodiment of the present disclosure will be described with reference to the case illustrated in FIG. 1A where one second functional region 120 is disposed at one side of the first functional region 110, by way of example. At the same time, as illustrated in FIG. 1A, FIG. 1B and FIG. 1C, a three-dimensional coordinate system is created by taking the base substrate 100 of the array substrate as a reference, so as to explain respective locations of components in the array substrate. The X direction and the Y direction are parallel to a plane direction of the base substrate 100, and also parallel to a direction of the first functional region 110 and the second functional region 120. The X direction is perpendicular to the Y direction. The Z direction is perpendicular to the plane direction of the base substrate 100.

In at least one embodiment of the present disclosure, an amount of the recess 300 disposed in the bending region 130 is not particularly limited but can be configured according to actual demands. For example, in at least one embodiment of the present disclosure, as illustrated in FIG. 1A, a plurality of recesses 300 can be disposed in the bending region 130, and the amount of the recesses 300 allows the recesses 300 to be in a one-to-one correspondence with the structures (e.g., the signal line 400 in the embodiment described below) to be disposed in the recess 300. For example, in at least one embodiment of the present disclosure, only one recess 300 is disposed in the bending region 130; for example, a plurality of smaller recesses 300 can be communicated with each other to constitute one larger recess, as illustrated in FIG. 1A.

An extension shape or an extension direction of the recess 300 in the bending region 130 is not particularly limited in the embodiment of the present disclosure but can be determined according to actual demands. For example, the extension shape of the recess 300 is not limited to a straight-line shape as illustrated in FIG. 1A and FIG. 1B but can also be a wave-like shape; for example, the extension direction of the recess 300 is not limited to a direction parallel to the X direction as illustrated in FIG. 1A and FIG. 1B but can also be a direction having an included angle with respect to the X direction.

Hereinafter, technical solution(s) of the following, at least one embodiment of the present disclosure will be described with reference to the case illustrated in FIG. 1A, FIG. 1B and FIG. 1C where a plurality of recesses 300*a* is provided and each recess has an extension shape of straight line and an extension direction parallel to the X direction, by way of example. It should be explained that, in order for convenience of explaining technical solution(s) of the present disclosure, the first functional region 110, the second functional region 120 and the bending region 130 in the following, at least one embodiment of the present disclosure are not limited to be formed by a division of only the entire area of the base substrate 100 but can be formed by a division of the entire area of the array substrate along a direction perpendicular to the base substrate 100. For example, in the following, at least one embodiment of the present disclosure, a portion of the insulating layer 200, that is corresponding to a portion of the base substrate 100 located in the first functional region 110, can be directly referred to as "the insulating layer 200 in the first functional region 110".

In at least one embodiment of the present disclosure, a width of the bending region 130 and a length of the recess 300 are not particularly limited but can be configured as any specific values according to actual demands. In at least one embodiment of the present disclosure, as illustrated in FIG. 1A, FIG. 1B and FIG. 1C, in a direction parallel to the X direction, the length of the recess 300 can be about 1.6 mm-2.0 mm, for example, the length of the recess 300 can further be 1.8 mm, 1.9 mm and the like.

Figure 2:
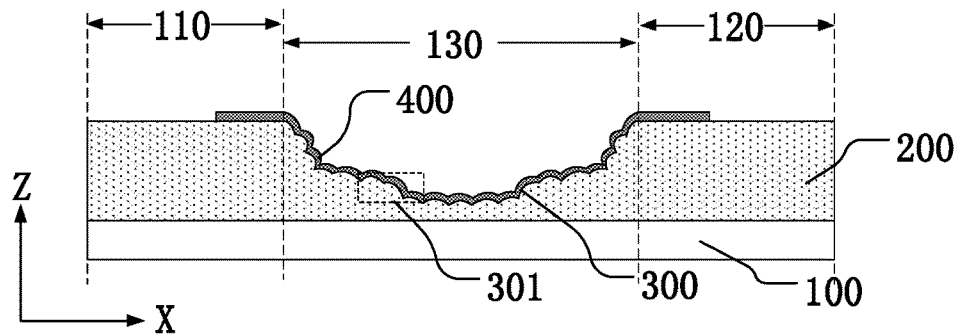
FIG. 2 is a cross-sectional view of a partial structure of another array substrate provided by an embodiment of the present disclosure.

For example, in at least one embodiment of the present disclosure, FIG. 2 is a cross-sectional view of a partial structure of another array substrate provided by an embodiment of the present disclosure. For example, as illustrated in FIG. 2, the array substrate further includes a signal line 400 which is at least partly disposed in the recess 300. The signal line 400 covers at least part of the concave-convex structure 301. The signal line 400 in the bending region 130 is formed on the concave-convex structure 301, and the concave-convex structure 301 makes a surface of the signal line 400 in the bending region 130 uneven too. For example, in at least one embodiment of the present disclosure, as illustrated in FIG. 2, the surface of the signal line 400 located in the recess 300 includes an uneven portion corresponding to the concave-convex structure 301. In this way, the concave-convex structure 301 allows the signal line 400 formed thereon to have an increased, extension area when bended, so that when bending the bending region 130, the signal line 400 in the bending region 130 may be extended by a relatively longer distance, so as to reduce the risk of breaking the signal line 400 during the bending process.

In at least one embodiment of the present disclosure, a thickness of the signal line 400 is not particularly limited.

For example, in a direction parallel to the Z direction, the thickness of the signal line 400 in the bending region 130 can be about 5000 Å~9000 Å, for example, the thickness of the signal line 400 can further be 6000 Å, 7000 Å, 8000 Å, and the like.

In at least one embodiment of the present disclosure, the type of the signal line 400 is not particularly limited. For example, in at least one embodiment of the present disclosure, as illustrated in FIG. 2, the signal line 400 can include at least one of a gate line, a data line and a common electrode line, or a combination thereof. Hereinafter, technical solution(s) of the following, at least one embodiment of the present disclosure will be described with reference to the case where the signal line is a data line, by way of example.

In at least one embodiment of the present disclosure, a specific structure of the insulating layer 200 is not particularly limited. The specific structure of the insulating layer 200 can be determined according to the actual structural design of the array substrate.

Figure 3:
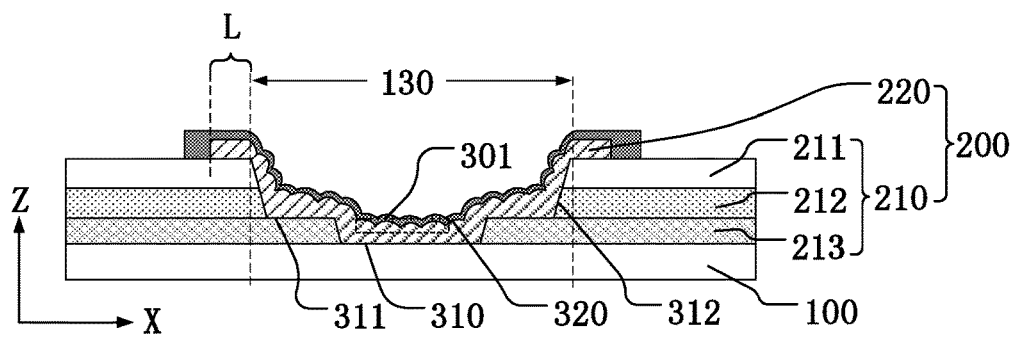
FIG. 3 is a cross-sectional view of a partial structure of another array substrate provided by an embodiment of the present disclosure.

FIG. 3 is a cross-sectional view of a partial structure of another array substrate provided by an embodiment of the present disclosure. For example, in at least one embodiment of the present disclosure, the insulating layer 200 can include a first insulating layer 210 which at least covers the bending region 130. Correspondingly, the recess 300 can include a first recess 310 disposed in the first insulating layer 210. The first insulating layer 210 can have a single-layered structure, and can also have a multi-layered, composite structure. In at least one embodiment of the present disclosure, a specific structure of the first insulating layer 210 is not particularly limited. For example, the signal line 400 is a lead of data line or a lead of gate line; the first insulating layer 210 can include one of an interlayered insulating layer 211, a gate insulating layer 212 and a buffer layer 213, or a combination thereof; an arrangement manner of structures such as the interlayered insulating layer 211, the gate insulating layer 212 and the buffer layer 213 can be designed according to the type of thin film transistor and the actual technical process, without particularly limited in the embodiment of the present disclosure.

For example, in at least one embodiment of the present disclosure, the signal line 400 can be directly disposed on the first recess 310. In this way, the concave-convex structure 301 can be disposed on the surface of the first recess 310.

The recess 300 can reduce a bending radius of the signal line 400 in the bending region 130, and can also increase the extension area of the surface of the signal line 400 in the bending region 130. However, when arranging the signal line 400, if a side of the recess 300 close to the first functional region 110 and the second functional region 120 has an excessively greater slope, then the thickness of the signal line 400 would be relatively smaller, and different portions of the signal line 400 would be unevenly stretched during bending, which results in uneven stress in the stretched signal line 400 and leads to the risk that part of the signal line 400 may be broken due to excessively greater extent of stretching.

For example, in at least one embodiment of the present disclosure, as illustrated in FIG. 3, the first recess 310 includes a first side 311 and a second side 312 which are in the extending direction (a direction parallel to the X direction) of the first recess 310 and are disposed opposite to each other; the first side 311 is close to the first functional region 110, the second side 312 is close to the second functional region 120, and at least one of the first side 311 and the second side 312 is formed as one of an inclined surface, a stepped surface and an arc surface, or a combination thereof. The above-mentioned shapes can reduce a slope of the first side 311 and the second side 312 of the first recess 310. It should be explained that, in at least one embodiment of the present disclosure, a specific shape of the first side 311 and the second side 312 of the first recess 310 is not particularly limited, as long as it can reduce the slope of the first side 311 and the second side 312 of the first recess 310.

For example, in at least one embodiment of the present disclosure, as illustrated in FIG. 3, the insulating layer 200 can further include a second insulating layer 220 which at least covers the first recess 310. The second insulating layer 220 is located between the signal line 400 and the first insulating layer 210. The recess 300 can include a second recess 320 located in the second insulating layer 220 corresponding to the first recess 310. Correspondingly, in order to increase an extension area of a surface of the signal line 400 in the recess 300, the concave-convex structure 301 is formed on a surface of the second insulating layer 320 in the second recess 220.

The second insulating layer 220 can serve for buffering between the first insulating layer 210 and the signal line 400. For example, the second insulating layer 220 can buffer a slope of the first recess 310; for example, a material of preparing the second insulating layer 220 can include a material with good elasticity, which can buffer a bending stress in the signal line 400 during bending, and allows a tension force subjected by the signal line 400 to be more uniform, thereby preventing from a breakage of the signal line 400 due to excessively greater local stress during bending.

For example, in at least one embodiment of the present disclosure, an edge of the first functional region 110 of the array substrate close to the bending region 130, as well as an edge of the second functional region 120 close to the bending region 130, can also be provided with a part of the second insulating layer 220, so as to further improve a protecting effect to the signal line 400. A dimension of the second insulating layer 220 (e.g., a width L of the second insulating layer 220 in the first functional region 110 along the direction parallel to the X direction, as illustrated in FIG. 3) reserved in the first functional region 110 and the second functional region 120 of the array substrate can be determined based on actual demands, without particularly limited in the embodiment of the present disclosure.

For example, in at least one embodiment of the present disclosure, a material of preparing the second insulating layer 220 can include at least one of polyimide and photoresist. An arrangement manner of the concave-convex structure 301 in the second recess 320 is varied depending on the material of preparing the second insulating layer 220. The arrangement manner of the concave-convex structure 301 can refer to related content(s) in the following embodiment(s) (the embodiment(s) related to the manufacturing method of the array substrate), without repeatedly described in the embodiment of the present disclosure. In at least one embodiment of the present disclosure, the material of preparing the second insulating layer 220 is not particularly limited, as long as the second insulating layer 220 can buffer the slope of the first recess 310 or can buffer a force subjected by the signal line 400 during bending.

At least one embodiment of the present disclosure provides a display panel including the array substrate described in any of the preceding embodiments. In the display panel provide by at least one embodiment of the present disclosure, the bending region 130 of the array substrate can be bended so as to position the second functional region 120 of the array substrate at a backside of the first functional region 110 (the backside is a side of the base substrate 100 in the first functional region 110 far away from the insulating layer 200). For example, the array substrate provided by at least one embodiment of the present disclosure can be a flexible substrate. Correspondingly, the display panel including such array substrate can also be a flexible display panel.

An example of the display panel is a liquid crystal display (LCD) panel, including the array substrate of the preceding embodiments and an opposite substrate, which are disposed opposite to each other to form a LC cell, and the LC cell is filled with LC materials. The opposite substrate can be, for example, a color filter substrate. A pixel electrode in each pixel unit of the array substrate is configured to generate an electric field so as to control a rotation degree of the LC materials and hence to perform a display operation.

Another example of the display panel is an organic light-emitting diode (OLED) panel in which the array substrate is formed with stacked layers of organic light-emitting materials. A cathode and an anode of each pixel unit are configured to drive the organic light-emitting materials to emit light, so as to perform a display operation.

Yet another example of the display panel is an electronic paper display panel in which the array substrate is formed with an electronic ink layer. A pixel electrode in each pixel unit is configured to apply a voltage which can drive a charged particle in the electronic ink to move so as to perform a display operation.

At least one embodiment of the present disclosure provides a display device including the display panel described in any of the preceding embodiments.

For example, the display device can be any device or apparatus with display function such as a displayer, a tablet computer, a mobile phone, a television, a camera and a navigation device which include the display panel described in the preceding embodiments.

At least one embodiment of the present disclosure provides a manufacturing method of an array substrate, including: providing a base substrate; forming an insulating layer on the base substrate, the base substrate including a first functional region, a second functional region disposed around the first functional region, and a bending region disposed between the first functional region and the second functional region; and forming at least one recess in the insulating layer in the bending region, wherein a surface of the recess is formed with a concave-convex structure. The concave-convex structure can increase an extension area of the surface of the recess, so as to avoid a breakage of a component on the surface of the recess during bending and to improve the product yield.

For example, the manufacturing method of an array substrate provided by at least one embodiment of the present disclosure further includes: forming a signal line on the base substrate formed with the insulating layer, wherein the signal line is at least partly located in the recess. The concave-convex structure can increase an extension area of the surface of the recess during bending, so as to avoid a breakage of a component such as a signal line on the surface of the recess during bending and to improve the product yield.

A specific structure of the array substrate obtained by the manufacturing method according to at least one embodiment of the present disclosure can refer to related content(s) of the preceding embodiment(s) (the embodiment(s) related to the array substrate), without repeatedly described herein. Hereinafter a manufacturing method of an array substrate will be described through several examples.

Figure 4A:
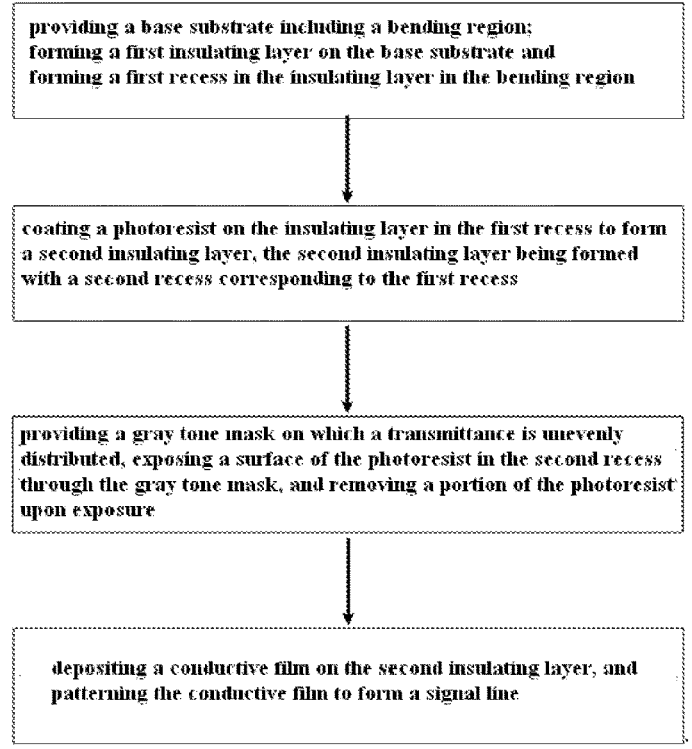
FIG. 4A is a flow chart of a manufacturing method of an array substrate provided by an embodiment of the present disclosure.

FIG. 4A is a flow chart of a manufacturing method of an array substrate provided by an embodiment of the present disclosure. By way of example, as illustrated in FIG. 4A, a manufacturing method of an array substrate can include: providing a base substrate including a bending region; forming a first insulating layer on the base substrate and forming a first recess in the insulating layer in the bending region; coating a photoresist on the insulating layer in the first recess to form a second insulating layer, the second insulating layer being formed with a second recess corresponding to the first recess; providing a gray tone mask on which a transmittance is unevenly distributed, exposing a surface of the photoresist in the second recess through the gray tone mask, and removing a portion of the photoresist upon exposure; depositing a conductive film on the second insulating layer, and patterning the conductive film to form a signal line. In this way, a material of forming the second insulating layer is the photoresist. By performing an uneven exposure to the photoresist, a concave-convex structure is directly formed in the recess. This simplifies the manufacturing method of the array substrate and also reduces the cost.

Figure 4B:
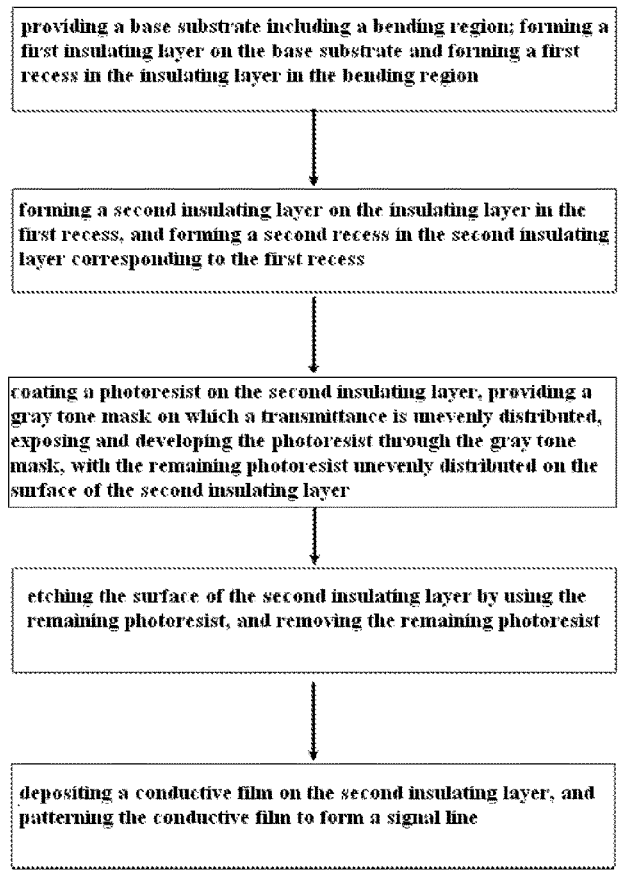
FIG. 4B is a flow chart of a manufacturing method of an array substrate provided by an embodiment of the present disclosure.

FIG. 4B is a flow chart of a manufacturing method of an array substrate provided by an embodiment of the present disclosure. By way of example, as illustrated in FIG. 4B, another manufacturing method of the array substrate can include: providing a base substrate including a bending region; forming a first insulating layer on the base substrate and forming a first recess in the insulating layer in the bending region; forming a second insulating layer on the insulating layer in the first recess, and forming a second recess in the second insulating layer corresponding to the first recess; coating a photoresist on the second insulating layer, providing a gray tone mask on which a transmittance is unevenly distributed, exposing and developing the photoresist through the gray tone mask, with the remaining photoresist unevenly distributed on the surface of the second insulating layer; etching the surface of the second insulating layer by using the remaining photoresist, and removing the remaining photoresist; depositing a conductive film on the second insulating layer, and patterning the conductive film to form a signal line. By patterning the second insulating layer using a pattern obtained through an uneven exposure of the photoresist, a concave-convex structure is formed on the surface of the second insulating layer. In this way, a material of the second insulating layer can be selected according to the actual technical process.

Figure 4C:
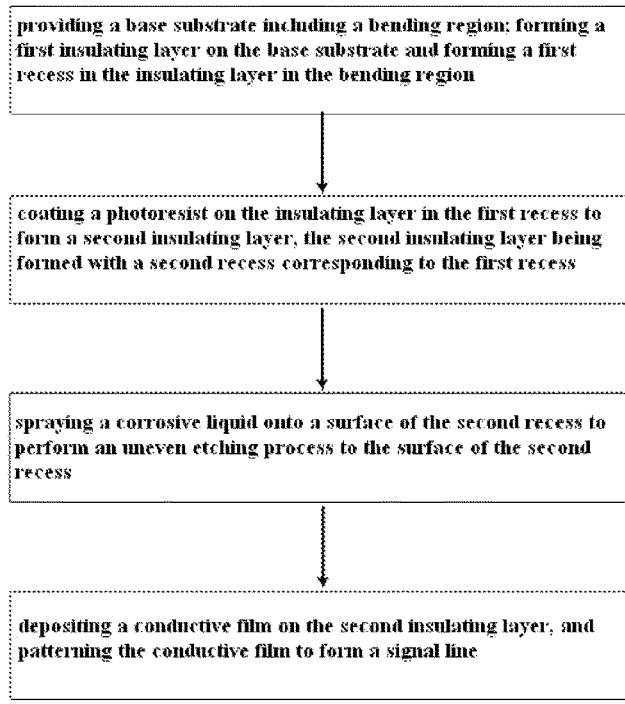
FIG. 4C is a flow chart of a manufacturing method of an array substrate provided by an embodiment of the present disclosure.

FIG. 4C is a flow chart of a manufacturing method of an array substrate provided by an embodiment of the present disclosure. By way of example, as illustrated in FIG. 4C, another manufacturing method of the array substrate can include: providing a base substrate including a bending region; forming a first insulating layer on the base substrate and forming a first recess in the insulating layer in the bending region; coating a photoresist on the insulating layer in the first recess to form a second insulating layer, the second insulating layer being formed with a second recess corresponding to the first recess; spraying a corrosive liquid onto a surface of the second recess to perform an uneven etching process to the surface of the second recess; depositing a conductive film on the second insulating layer, and patterning the conductive film to form a signal line. The corrosive liquid as sprayed is unevenly distributed on the surface of the second insulating layer, so that the surface of the second insulating layer is unevenly etched, which forms a concave-convex structure on the surface of the second insulating layer with simplified technical process.

Hereinafter, a specific manufacturing method of an array substrate will be described in more details through at least one embodiment.

A manufacturing method of an array substrate in at least one embodiment of the present disclosure is described with reference to the structure of the array substrate as illustrated in FIG. 3, by way of, example. FIGS. 5A-5D are process diagrams of a manufacturing method of an array substrate provided by an embodiment of the present disclosure. As illustrated in FIGS. 5A-5D, a manufacturing method of an array substrate provided by at least one embodiment of the present disclosure can include processes as below.

Figure 5A:
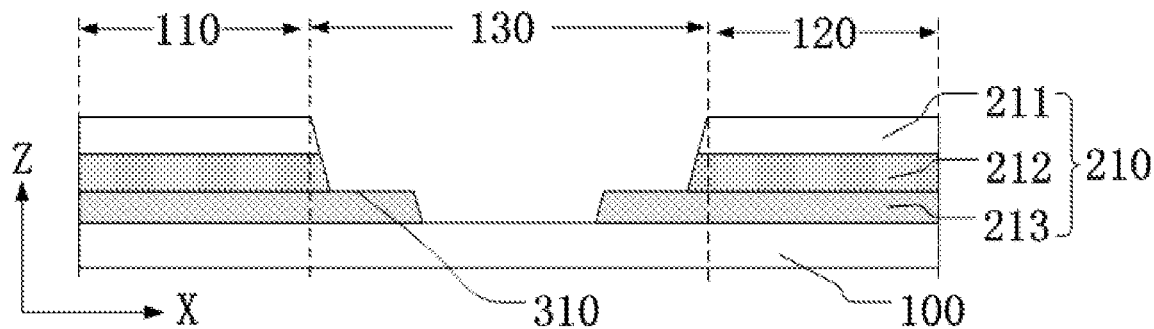
FIGS. 5A-5D are process diagrams of a manufacturing method of an array substrate provided by an embodiment of the present disclosure.

As illustrated in FIG. 5A, providing a base substrate 100 including a first functional region 110, a second functional region 120 disposed around the first functional region 110, and a bending region 130 disposed between the first functional region 110 and the second functional region 120; depositing a first insulating layer film onto the base substrate 100 and patterning the first insulating layer film to form a first insulating layer 210, the first insulating layer 210 including at least one first recess 310 located in the bending region 130. Specific structures of the first insulating layer 210 and the first recess 310 can refer to related content(s) in preceding embodiment(s) (the embodiment(s) related to the array substrate) without repeatedly described in the embodiment of the present disclosure.

For example, in at least one embodiment of the present disclosure, the patterning process can include dry etching or wet etching. For example, the patterning process can include: coating a photoresist layer onto a structural layer to be patterned; exposing the photoresist layer using a mask; developing the photoresist layer upon exposure to obtain a photoresist pattern; etching the structural layer by using the photoresist pattern as a mask; and optionally removing the photoresist pattern.

Figure 5B:
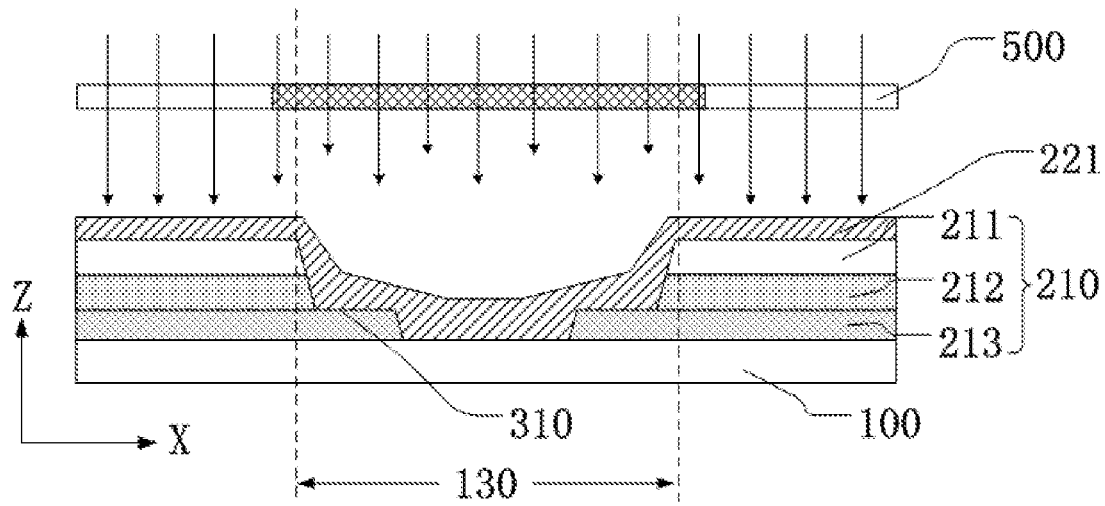

As illustrated in FIG. 5B, depositing a second insulating layer film such as a photoresist film 221 on the base substrate 100 formed with the first insulating layer 210; providing a gray tone mask 500 on which a transmittance is unevenly distributed; and exposing the photoresist film 221 through the gray tone mask 500.

A distribution of transmittance on the gray tone mask 500 can be designed according to actual demands, as long as the gray tone mask 500 allows for a concave-convex structure to be formed on the surface of the second insulating layer 220 in the recess 300. In at least one embodiment of the present disclosure, a specific structure of the gray tone mask 500 is not particularly limited. For example, a portion of the gray tone mask 500 corresponding to the recess 300 has a relatively lower and unevenly distributed transmittance. for example, the transmittance in this portion can be about 10%-40%, and further be about 20%-30%; the remaining portion of the gray tone mask 500 has a relatively greater transmittance; in this way, a portion of the photoresist film 221 in the recess 300 is partly exposed while the remaining portion of the photoresist film 221 is completely exposed.

In order to improve the function of the second insulating layer 220 buffering the slope of the recess 200, a portion of the second insulating layer 220 can be reserved at an edge of the first functional region 110 in contact with the bending region 130 and an edge of the second functional region 120 in contact with the bending region 130. In this way, a portion of the gray tone mask 500 corresponding to this portion of the second insulating layer 220 can be configured to have a respectively lower transmittance or configured as nontransparent to light.

For example, in at least one embodiment of the present disclosure, the photoresist film 221 can be of a positive photoresist.

Figure 5C:
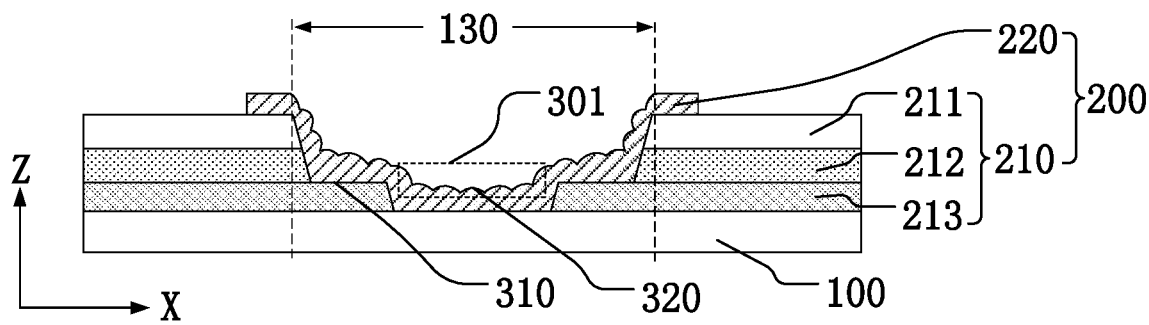

As illustrated in FIG. 5C, upon exposing the photoresist film 221, developing the photoresist film 221 to remove an exposed portion of the photoresist film 221 so as to obtain a second insulating layer 220; and forming a second recess 320 in the second insulating layer 220, wherein a surface of the second recess 320 is formed with a concave-convex structure 301.

It should be explained that, in at least one embodiment of the present disclosure, the second insulating layer 220 is not limited to the photoresist in the embodiment above. A material of preparing the second insulating layer 220 can be polyimide and the like. For example, performing an uneven etching process to the surface of the second insulating layer 220 in the first recess 310 by using dry etching or wet etching so as to form the concave-convex structure 301 on the surface of the second recess 320. By way of example, the uneven etching process can be achieved by spraying a corrosive liquid onto the surface of the second insulating layer 220 in the first recess 310.

For example, in the process of manufacturing the array substrate as illustrated in FIGS. 5B-5C, the photoresist film 221 can be coated at a certain thickness so that the second recess 320 can be directly formed upon coating the photoresist film 221. Alternatively, the photoresist film 221 can flatten a surface of the array substrate, that is, completely filling the first recess 310, and the second recess is formed later by exposing the photoresist film 221 as illustrated in FIG. 5B.

Figure 5D:
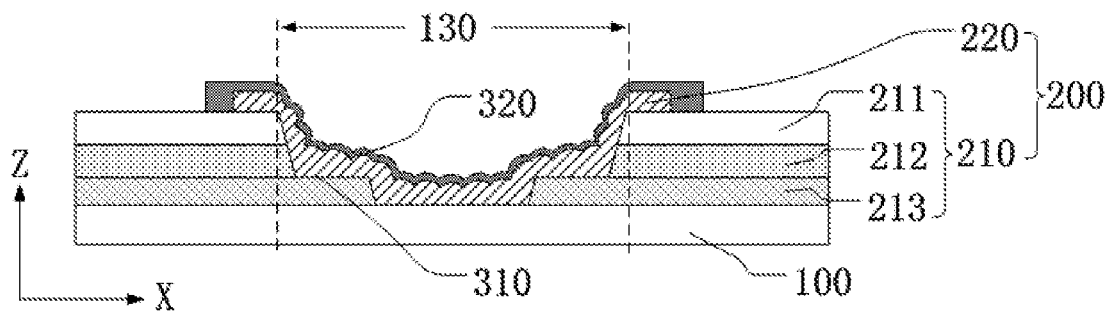

As illustrated in FIG. 5D, depositing a conductive film on the base substrate 100 formed with the insulating layer 200 and patterning the conductive film to form a signal line 400. The signal line 400 is at least partly located in the recess 300. The type of the signal line 400 can refer to related content(s) in preceding embodiment(s) (the embodiment(s) related to the array substrate) without repeatedly described in the embodiment of the present disclosure.

A manufacturing method of an array substrate in at least one embodiment of the present disclosure is described with reference to the structure of the array substrate as illustrated in FIG. 3, by way of example. FIGS. 6A-6F are process diagrams of another manufacturing method of an array substrate provided by an embodiment of the present disclosure. As illustrated in FIGS. 6A-6F, a manufacturing method of an array substrate provided by at least one embodiment of the present disclosure can include processes as below.

Figure 6A:
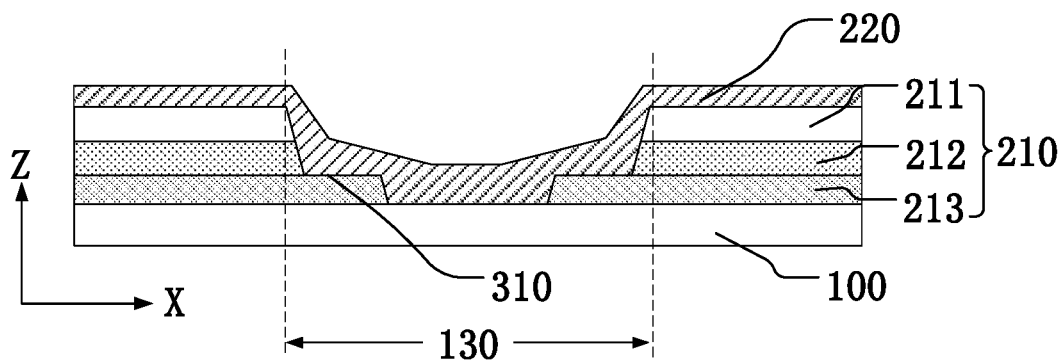
FIGS. 6A-6F are process diagrams of another manufacturing method of an array substrate provided by an embodiment of the present disclosure.

As illustrated in FIG. 6A, depositing a second insulating layer film on the base substrate 100 formed with the first insulating layer 210 to form a second insulating layer 220. The specific structure of the base substrate 100 formed with the first insulating layer 210 can refer to the content(s) in the embodiment illustrated in FIG. 5A, without repeatedly described in the embodiment of the present disclosure.

Figure 6B:
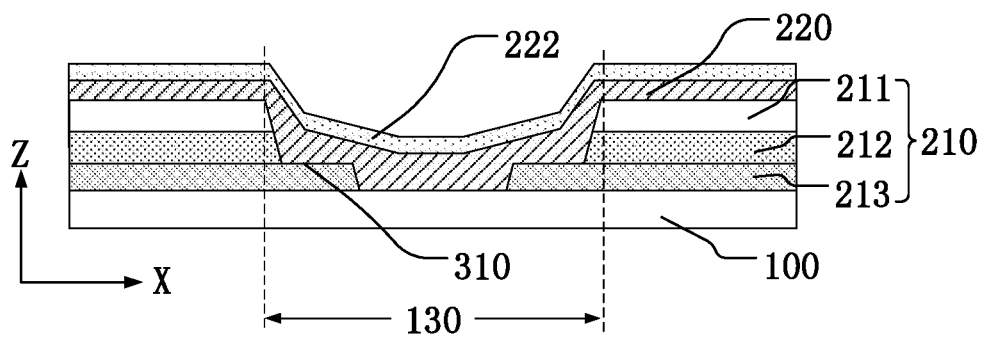

As illustrated in FIG. 6B, depositing a photoresist 222 on the base substrate 100 formed with the second insulating layer 220. The photoresist 222 at least covers the second insulating layer 220 in the bending region 130.

Figure 6C:
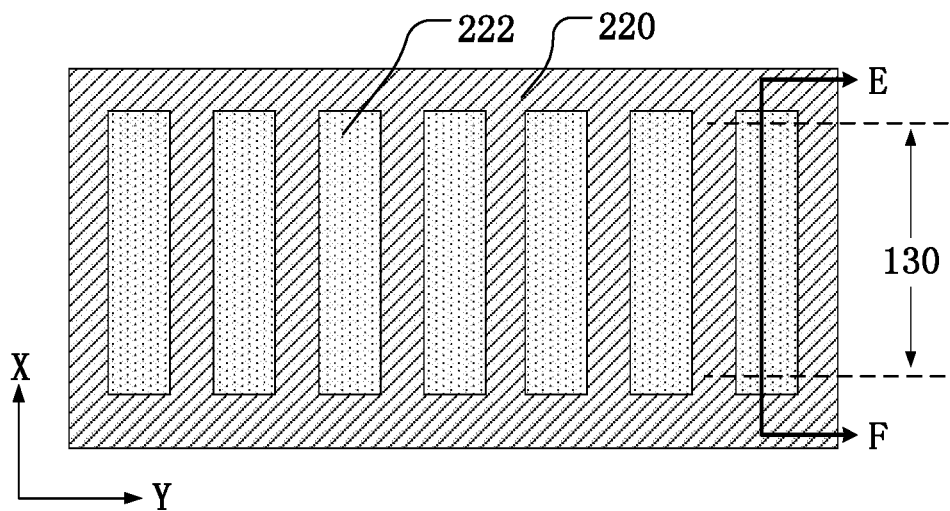
Figure 6D:
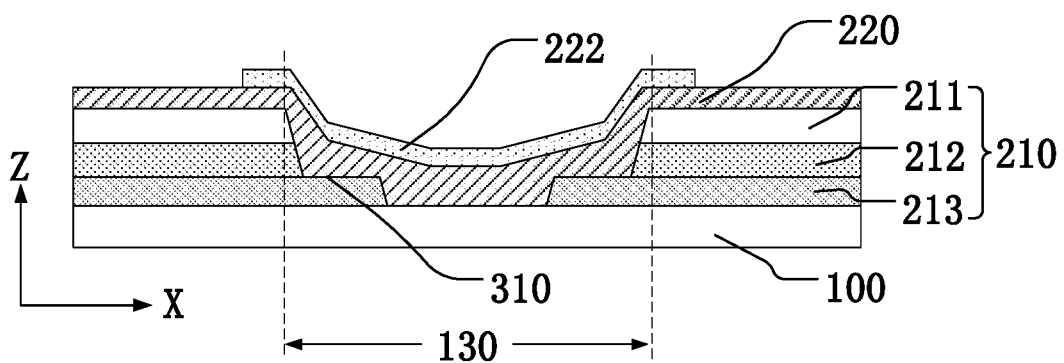

FIG. 6D is a cross-sectional view taken along E-F of FIG. 6C. As illustrated in FIG. 6C and FIG. 6D, exposing and developing the photoresist 222, with the remaining portion of the photoresist 222 being in one-to-one correspondence with the first recess 310. For example, the remaining portion of the photoresist 222 covers at least part of the first recess 310; further, the remaining portion of the photoresist 222 completely covers the first recess 310.

Figure 6E:
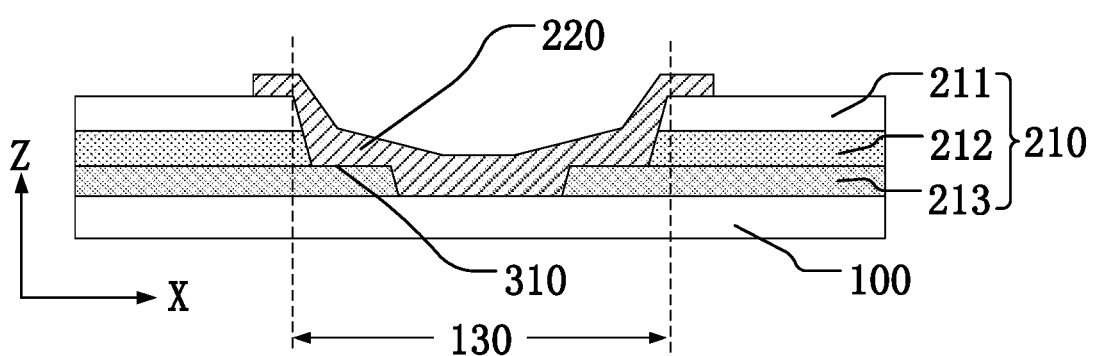

As illustrated in FIG. 6E, patterning the second insulating layer 220 using the photoresist 220; removing a portion of the second insulating layer 220 not covered with the photoresist 222; and removing the photoresist 222 located on the second insulating layer 220.

Figure 6F:
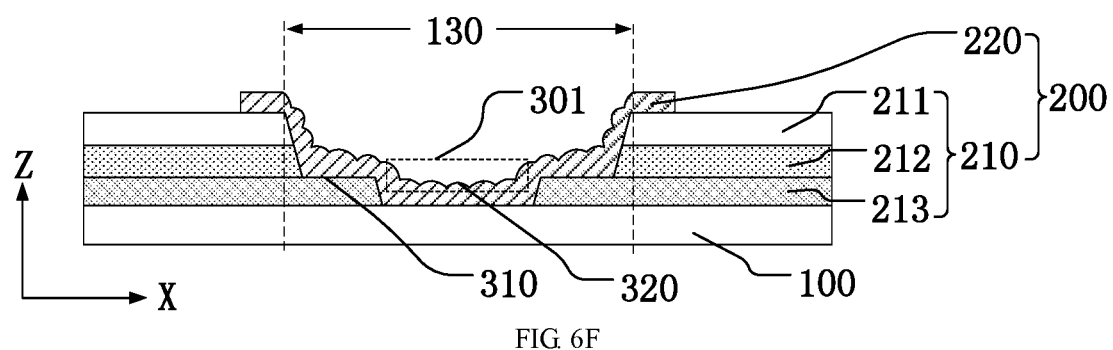

As illustrated in FIG. 6F, performing an uneven etching process to the surface of the second insulating layer 220 by spraying a corrosive liquid. The surface of the second insulating layer 220 is partly formed into the concave-convex structure 301.

It should be explained that, in the manufacturing method of the array substrate as illustrated in FIGS. 6B-6F, after forming a photoresist on the second insulating layer, the photoresist can be exposed by using a gray tone mask on which a transmittance is unevenly distributed. In the embodiment illustrated in FIG. 6C, each photoresist 222 includes a plurality of photoresist units arranged at intervals. The second insulating layer can be patterned by using each of the photoresist units so that a portion of the surface of the second insulating layer covered with the photoresist unit is formed into a convex portion and a portion of the surface of the second insulating layer not covered with the photoresist unit is formed into a concave portion. Then the concave-convex structure 301 as illustrated in FIG. 6F can be obtained after removing the photoresist unit(s).

After obtaining the array substrate as illustrated in FIG. 6F, a process of forming a signal line on the array substrate can refer to the content(s) of embodiment(s) illustrated in FIG. 5D without repeatedly described in the embodiment of the present disclosure.

It should be explained that, in at least one embodiment of the present disclosure, a formation of the second insulating layer 220 may be omitted. Correspondingly, a surface of the first recess 310 can be unevenly etched by using wet etching or dry etching, so as to form the concave-convex structure 301 on the surface of the first recess 310.

It should be explained that, in the embodiments above of the present disclosure, the description of uneven etching or uneven exposure as used in forming the concave-convex structure 301 in the recess 300 is given macroscopically by taking the recess 300 as a reference, but is not given microcosmically by taking the concave-convex structure 301 as a reference. For example, only unevenly etching the surface of the recess 300 can form a concave-convex structure 301, but the concave-convex structures 301 on the surface of the recess 300 can have a same dimension and can also be distributed according to a certain rule, without particularly limited in the present disclosure.

For example, in the embodiments above of the present disclosure, after finishing the manufacturing process of the array substrate, the bending region 130 of the array substrate can be bended so as to position the second functional region 120 of the array substrate at a backside of the first functional region 110. It should be explained that, the bending operation can be determined according to actual, process conditions without particularly limited in the embodiments of the present disclosure. For example, the array substrate can be bended after the manufacturing process of the array substrate is finished; for another example, the display panel including the array substrate can be bended after the manufacturing process of the display panel is finished.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness a layer or area may be enlarged or narrowed, that is, the drawings are not drawn in a real scale.

(3) In case of no conflict, features in one embodiment or in different embodiments can be combined.

The above are merely specific implementations of the present disclosure without limiting the protection scope of the present disclosure thereto. The protection scope of the present disclosure should be based on the protection scope of the appended claims.

What is claimed is:

1. An array substrate, comprising:
   a base substrate comprising a bending region; and
   an insulating layer disposed on the base substrate,
   wherein the insulating layer located in the bending region is provided with at least one recess, and a surface of the recess comprises a concave-convex structure, and wherein
   the insulating layer comprises a first insulating later, the first insulating layer is configured to at least cover the bending region; and the recess comprises a first recess disposed in the first insulating layer, the first recess has a flat surface;
   the insulating layer further comprises a second insulating layer configured to at least cover the first recess, the second insulating layer is located between the signal line and the first insulating layer, the recess comprising a second recess located in the second insulating layer corresponding the first recess, at least a portion of the second recess corresponding to the flat surface of the first recess comprises the concave-convex structure.

2. The array substrate according to claim 1, further comprising a signal line at least partly disposed in the recess, wherein
   the signal line is configured to cover at least part of the concave-convex structure.

3. The array substrate according to claim 2, wherein
   a surface of the signal line located in the recess comprises an uneven portion corresponding to the concave-convex structure.

4. The array substrate according to claim 1, wherein
   the first recess further comprises a first side and a second side which are disposed along an extending direction of the first recess and are disposed opposite to each other, the flat surface connects the first side and the second side,
   at least one of the first side and the second side is formed as one of an inclined surface, a stepped surface and an arc surface, or a combination thereof.

5. The array substrate according to claim 1, wherein
   the second insulating layer comprises at least one of polyimide and photoresist.

6. The array substrate according to claim 1, wherein
   the concave-convex structure comprises at least one of: at least one convex portion and at least one concave portion.

7. A display panel, comprising an array substrate,
   the array substrate comprising:
   a base substrate comprising a bending region; and
   an insulating layer disposed on the base substrate,
   wherein the insulating layer located in the bending region is provided with at least one recess, and a surface of the recess comprises a concave-convex structure, and wherein
   the insulating layer comprises a first insulating layer, the first insulating layer configured to at least cover the bending region; and the recess comprises a first recess disposed in the first insulating layer, the first recess has a flat surface;

the insulating layer further comprises a second insulating layer configured to at least cover the first recess, the recess comprises second recess located in the second insulating layer corresponding to the first recess, at least a portion of the second recess corresponding to the flat surface of the first recess comprises the concave-convex structure.

8. A display device, comprising the display panel according to claim 7.

9. A manufacturing method of an array substrate, comprising:

providing a base substrate;

forming an insulating layer on the base substrate, the base substrate comprising a bending region; and forming at least one recess in the insulating layer in the bending region, wherein a surface of the recess is formed with a concave-convex structure, wherein forming the insulating layer and forming the recess in the insulating layer comprises:

forming a first insulating layer on the base substrate, the first insulating layer at least covering the bending region; and forming a first recess in the first insulating layer in the bending region, wherein the first recess has a flat surface, wherein forming the insulating layer and forming the recess in the insulating layer further comprises:

forming a second insulating layer on the base substrate formed with the first insulating layer, the second insulating layer at least covering the first recess, the second insulating being located between, the signal line and the first insulating layer; and forming a second recess in the second insulating layer corresponding to the first recess, at least a portion of the second recess corresponding to the flat surface, of the first recess comprises the concave-convex structure.

10. The manufacturing method according to claim 9, further comprising:

forming a signal line on the base substrate formed with the insulating layer, wherein the signal line is at least partly located in the recess.

11. The manufacturing method according to claim 9, wherein forming the concave-convex structure on the surface of the recess comprises:

coating a photoresist on the second insulating layer;

providing a gray tone mask on which a transmittance is uniformly distributed, exposing and developing the photoresist through the gray tone mask, with a remaining portion of the photoresist being unevenly distributed on a surface of the second recess; and etching a surface of the second insulating layer by using the remaining portion of the photoresist and then removing the remaining portion of the photoresist.

12. The manufacturing method according to claim 9, wherein forming the concave-convex structure on the surface of the recess comprises:

spraying a corrosive liquid onto a surface of the second recess to perform an uneven etching process to the surface of the second recess.

13. The display panel according to claim 7, wherein the array substrate further comprises a signal line at least partly disposed in the recess, wherein the signal line is configured to cover at least part of the concave-convex structure.

14. The display panel according to claim 13, wherein a surface of the signal line located in the recess comprises an uneven portion corresponding to the concave-convex structure.

* * * * *